(12) United States Patent
Jang

(10) Patent No.: US 6,661,044 B2
(45) Date of Patent: *Dec. 9, 2003

(54) METHOD OF MANUFACTURING MOSEFT AND STRUCTURE THEREOF

(75) Inventor: Wen-Yueh Jang, Hsinchu (TW)

(73) Assignee: Winbond Electronics Corp., Hisnchu (TW)

( * ) Notice: Subject to any disclaimer, the term of this patent is extended or adjusted under 35 U.S.C. 154(b) by 171 days.

This patent is subject to a terminal disclaimer.

(21) Appl. No.: 10/037,898

(22) Filed: Oct. 22, 2001

(65) Prior Publication Data

US 2003/0075730 A1 Apr. 24, 2003

(51) Int. Cl.⁷ .................. H01L 29/76; H01L 27/108; H01L 29/06
(52) U.S. Cl. .................. 257/288; 257/296; 257/300; 257/618; 257/623; 257/906
(58) Field of Search ........................ 257/296, 288, 257/300, 618, 623, 906; 438/197, 238, 239, 386, 399, 978

(56) References Cited

U.S. PATENT DOCUMENTS

| 5,270,257 | A | * | 12/1993 | Shin | 257/244 |
| 5,563,077 | A | * | 10/1996 | Ha | 257/401 |
| 5,859,451 | A | * | 1/1999 | Narita | 257/296 |
| 6,033,943 | A | * | 3/2000 | Gardner | 438/199 |
| 6,077,749 | A | * | 6/2000 | Gardner et al. | 438/275 |
| 6,096,630 | A | * | 8/2000 | Byun et al. | 257/412 |
| 6,121,651 | A | * | 9/2000 | Furukawa et al. | 257/288 |
| 6,124,623 | A | * | 9/2000 | Kamata | 257/296 |
| 6,136,643 | A | * | 10/2000 | Jeng et al. | 438/253 |
| 6,174,774 | B1 | * | 1/2001 | Lee | 438/257 |
| 6,180,491 | B1 | * | 1/2001 | Joyner et al. | 438/424 |
| 6,248,632 | B1 | * | 6/2001 | Jang et al. | 438/258 |
| 6,251,747 | B1 | * | 6/2001 | Zheng et al. | 257/510 |
| 6,323,082 | B1 | * | 11/2001 | Furukawa et al. | 438/247 |
| 6,342,410 | B1 | * | 1/2002 | Yu | 438/164 |
| 6,359,311 | B1 | * | 3/2002 | Colinge et al. | 257/347 |
| 6,387,815 | B2 | * | 5/2002 | Sakamoto | 438/709 |
| 6,410,952 | B2 | * | 6/2002 | Momose et al. | 257/288 |

FOREIGN PATENT DOCUMENTS

EP          0 599 506 A1 *  6/1994

* cited by examiner

Primary Examiner—Wael Fahmy
Assistant Examiner—Shrinivas H. Rao
(74) Attorney, Agent, or Firm—J.C. Patents

(57) ABSTRACT

A method of manufacturing an MOSFET. A substrate is provided. A trench is formed in the substrate. A sacrificial layer is formed to fill the trench. A doped semiconductive layer is formed over the substrate. The doped semiconductive layer is patterned to form a device region, wherein the device region spans the sacrificial layer to expose a portion of the sacrificial layer. The sacrificial layer is removed. A gate dielectric layer is formed on the surface of the trench and on the top surface and the bottom surface of the device region. A conductive layer is formed on the gate dielectric layer. The conductive layer is patterned to form a horizontal surround gate surrounding the device region. A source/drain region is formed in a portion of the substrate adjacent to the device region.

14 Claims, 6 Drawing Sheets

METHOD OF MANUFACTURING MOSEFT AND STRUCTURE THEREOF

BACKGROUND OF THE INVENTION

1. Field of Invention

The present invention relates to a structure of a semiconductor device and a method for manufacturing the semiconductor device. More particularly, the present invention relates to a structure of a MOSEFT and a method for manufacturing the MOSEFT.

2. Description of Related Art

With the gradually shrinkage of the line width of the MOS, the leakage occurs easily at a portion of the source/drain far from the gate. The leakage phenomenon can be decreased by forming the gate dielectric layer with a relatively thin thickness. However, when the line width is shrunk down below 0.1 micron, even the extremely thin gate dielectric layer cannot block the leakage. In order to solve the problem mentioned above, Professor Chenming Hu in UC Berkeley suggests two solutions. One is to use a substrate with a relatively thin thickness in the formation of the MOSFET. Therefore, there is no conductive path far from the gate. The other solution is to form a MOSFET with a double-gate structure surrounding the channel region so that the whole channel region is well controlled by the gate electric field. Hence, the on-current is increased and the leakage is decreased.

According to the concepts provided by professor Hu, a fin-type field effect transistor (FET) is developed. FIGS. 1A through 1C are schematics of the structure of a fin-type FET, wherein FIG. 1B is a cross-sectional view of a portion of FIG. 1A along line I–I' and FIG. 1C is a cross-sectional view of a portion of FIG. 1A along line II–II'. The method for manufacturing the fin-type FET comprises the steps of providing a silicon-on-insulator (SOI) substrate 100. The thickness of the silicon layer (not shown) on the insulation layer 105 is 100 nm. Then, the thickness of the silicon layer is scaled down to 50 nm by performing the thermal oxidation. A hard mask layer 110 made of low temperature oxide (LTO) is formed on the silicon layer. A photolithography with a 100 eV electron beam and an anisotropic etching process are performed to pattern the hard mask layer 110 and the silicon layer to form a fin-type silicon layer 120 with a width about 20–50 nm. A poly Si—Ge layer (not shown) and a hard mask layer 130 made of LTO are subsequently formed over the substrate 100. The hard mask layer and the poly Si—Ge layer are patterned to form a risen-type source 140 and a risen-type drain 150 with a thickness larger than fin-type silicon layer 120.

As shown in FIG. 1A together with FIGS. 1B and 1C, a conformal silicon nitride layer (not shown) is formed over the substrate 100. An anisotropic etching process is performed to pattern the conformal silicon nitride layer into a spacer 160. In the anisotropic etching process, an over-etch step is performed even after a portion of the silicon nitride layer over the hard mask layer 130 is completely removed so that a spacer formed on the sidewall of the fin-type silicon layer 120 with a relatively small thickness is totally removed but spacers 160 formed on the sidewall of the risen-type source 140 and risen-type drain 150 still remains. As shown in FIGS. 1A and 1B, the sidewall of the fin-type silicon layer 120 is oxidized to form gate oxide layer 170. A poly Si—Ge layer (not shown) is formed over the substrate 100 to fill a space 190 between the spacers 160. The poly Si—Ge layer is patterned to form a gate 180.

Since the electron beam photolithography is used in the method for manufacturing fin-type FET to define the fin-type silicon layer 120, the width of the fin-type silicon layer 120 can be scaled down to about 20–50 nm in order to prevent the device from leakage. Moreover, as shown in FIGS. 1A and 1C, because electric field induced by the gate 180 is passing through both sidewalls of the fin-type silicon layer, the on-current of the device is relatively large. Nevertheless, because of the use of the SOI substrate, the cost of the device is high. Besides, during the formation of the spacer on the sidewall of the risen-type source and the risen-type drain, the sidewall of the fin-type silicon layer is damaged by the over-etch process so that the surface quality of the channel is poor and the performance of the device is worse. Additionally, it is hard to control the condition for forming the risen source and the risen drain to reduce source/drain resistance. Furthermore, since the width of the fin-type silicon layer 120 of the fin-type FET is relatively small in order to block the leakage, it is necessary to use the electron beam photolithography and the subsequent anisotropic etching process is hard to controlled and will damage the fin surface.

SUMMARY OF THE INVENTION

The invention provides a MOSFET structure with relatively less leakage phenomenon and relatively large on-current.

The invention also provide a method for manufacturing a MOSFET to decrease the leakage in the device and to increase the on-current of the device.

A MOSEFT provided by the invention comprises a substrate, a doped semiconductive layer, a gate dielectric layer, a gate and a source/drain region. The substrate possesses a trench formed therein. The doped semiconductive layer spans the trench and the doped semiconductive layer partially covers the trench. The gate dielectric layer is located on the surface of the trench and on the top surface and the bottom surface of the doped semiconductive layer. The gate is located on the gate dielectric layer, wherein the gate surrounds a portion of the doped semiconductive layer over the trench. The source/drain region is located in the substrate adjacent to the portion of the doped semiconductive layer surrounded by the gate.

A method for manufacturing a MOSFET comprises the steps of providing a substrate. A trench is formed in the substrate. A sacrificial layer is formed to fill the trench. A doped semiconductive layer is formed over the substrate. The doped semiconductive layer is patterned to form a device region, wherein the device region spans the sacrificial layer to expose a portion of the sacrificial layer. The sacrificial layer is removed. A gate dielectric layer is formed on the surface of the trench and on the top surface and the bottom surface of the device region. A conductive layer is formed on the gate dielectric layer. The conductive layer is patterned to form a horizontal surround gate surrounding the channel region. A source/drain region is formed in a portion of the substrate adjacent to the channel region.

In the present invention, because the extra-thin doped semiconductive layer is used as a channel region, there is no channel portion far from the gate. Moreover, since the horizontal surround gate surrounds the channel region, the channel region is well controlled by the electric field. Therefore, the leakage can be greatly decreased and the on-current can be largely increased. Besides, the extra-thin doped crystallized semiconductive layer, such as a epitaxy silicon layer, replaces the conventional SOI film to be a channel region, so that the substrate cost can be decreased. Furthermore, by comparing it with the fin-type FET, since the surface of the doped crystallized semiconductive layer in the present invention is not formed by dry etching, the performance of the device won't be affected. Also, the source/drain region is formed by the conventional doping process in the invention. It is not necessary to form the risen source/drain. Therefore, the manufacturing process can be well controlled. Further, the thickness of the channel region depends on the thickness of the doped crystallized semiconductive layer. Therefore, the issues caused by the electron beam and the anisotropic etching process can be totally solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1C are schematics of the structure of a fin-type FET, wherein FIG. 1B is a cross-sectional view of a portion of FIG. 1A along line I–I' and FIG. 1C is a cross-sectional view of a portion of FIG. 1A along line II–II';

FIGS. 2A, 5B, 6A and 8B are the top views of FIGS. 2B, 5A, 6B and 8A, respectively, wherein FIGS. 2B, 5A, 6B and 8A are the cross-sectional views of FIGS. 2A, 5B, 6A and 8B along line III–III' on each figure;

DESCRIPTION OF THE PREFERRED EMBODIMENTS

FIGS. 2B, 3–4, 5A, 6B, 7, 8A and 9 are schematic, cross-sectional views of the process for manufacturing a MOSFET in a preferred embodiment according to the invention.

Figure 1A:
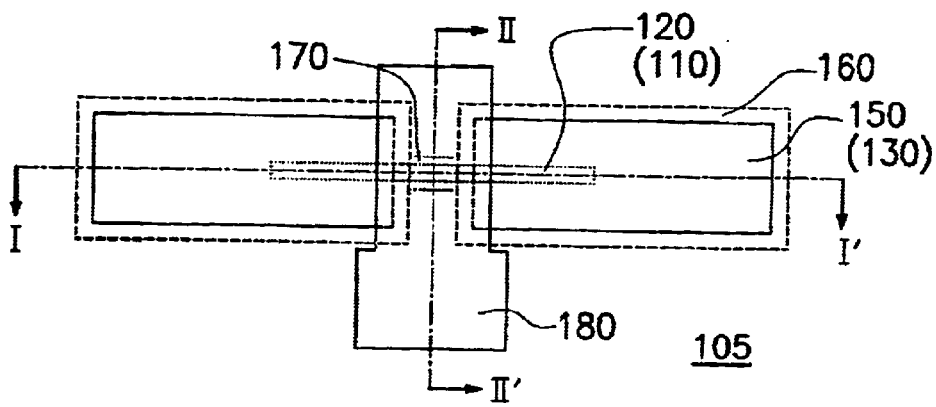
Figure 1B:
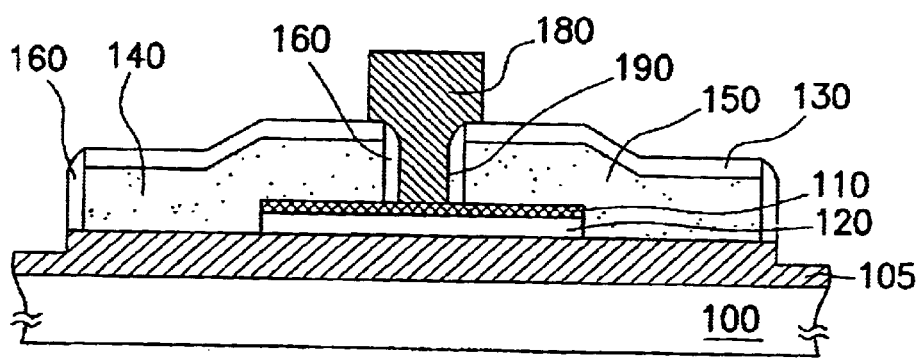
Figure 1C:
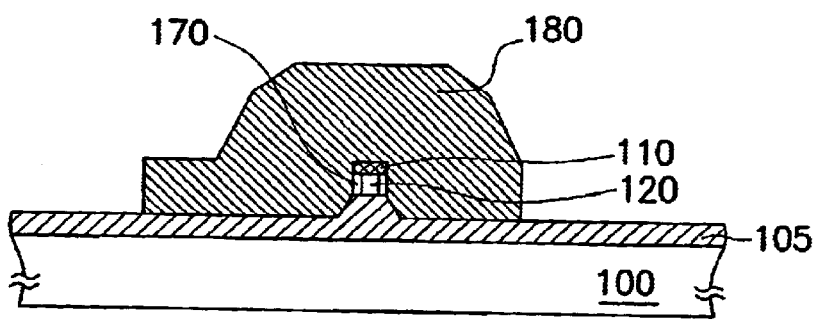
Figure 2A:
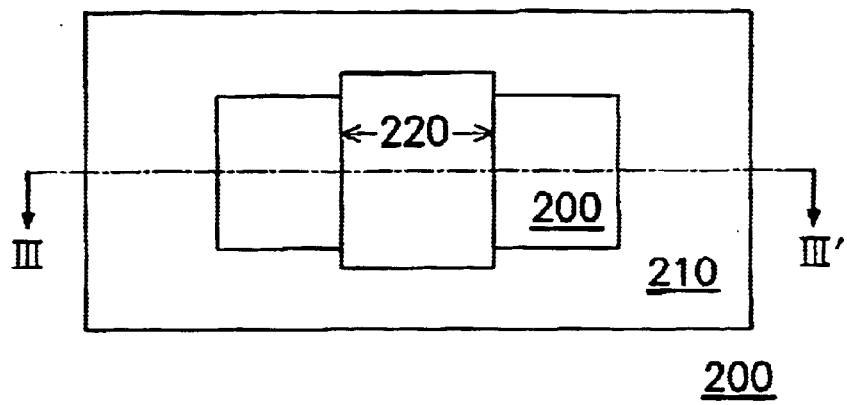
Figure 2B:
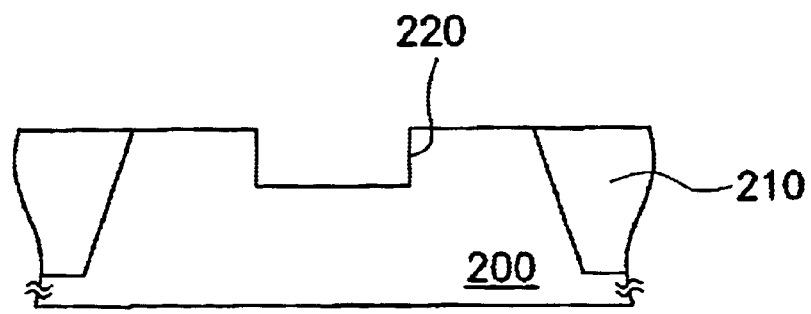
FIGS. 2B, 3–4, 5A, 6B, 7, 8A and 9 are schematic, cross-sectional views of the process for manufacturing a MOSFET in a preferred embodiment according to the invention.

FIGS. 2A, 5B, 6A and 8B are the top views of FIGS. 2B, 5A, 6B and 8A, respectively, wherein FIGS. 2B, 5A, 6B and 8A are the cross-sectional views of FIGS. 2A, 5B, 6A and 8B along line III–III' on each figure. Besides, FIG. 8C is a cross-sectional view of FIG. 8B along line IV–IV'; and As shown in FIGS. 2B and 2A, a substrate 200 is provided. The substrate 200 can be a bulky silicon substrate, for example. An annulus-type shallow trench isolation (STI) 210 is formed in the substrate 200. The STI 210 can be formed from silicon oxide by high density plasma chemical vapor deposition (HDPCVD), for example. A photolithography and etching process is performed to form a trench 220 in a portion of the substrate 200. The opposite sides of the trench 220 are extended to the STI 210. As shown in FIG. 2A, one opposite side of the trench 220 exposes the STI 210 an the depth of the trench 220 is about 0.05–0.3 micron.

Figure 3:
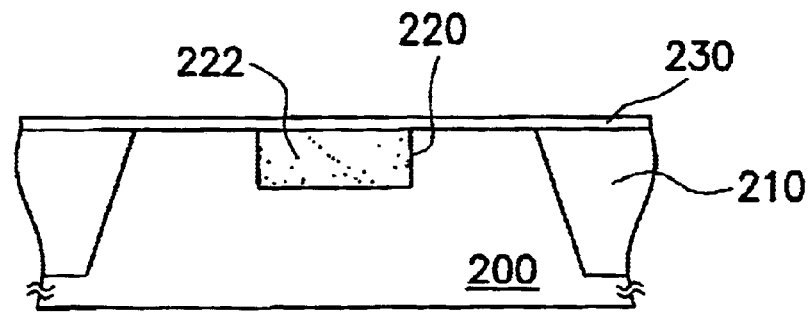

As shown in FIG. 3, a sacrificial layer 222 is formed to fill the trench 220. The sacrificial layer 222 is made of the material, such as silicon nitride, different from that of the STI 210. The method for forming the sacrificial layer 222 comprises the steps of using chemical vapor deposition to form a sacrificial material over the substrate 200 and removing a portion of the sacrificial material by chemical-mechanical polishing process to form a sacrificial layer 222. Thereafter, an amorphous semiconductive layer 230 is formed over the substrate. The amorphous semiconductive layer 230 can be an amorphous silicon layer formed by low-pressure chemical vapor deposition (LPCVD), for example. The thickness of the amorphous semiconductive layer 230 is about 1–50 nm.

Figure 4:
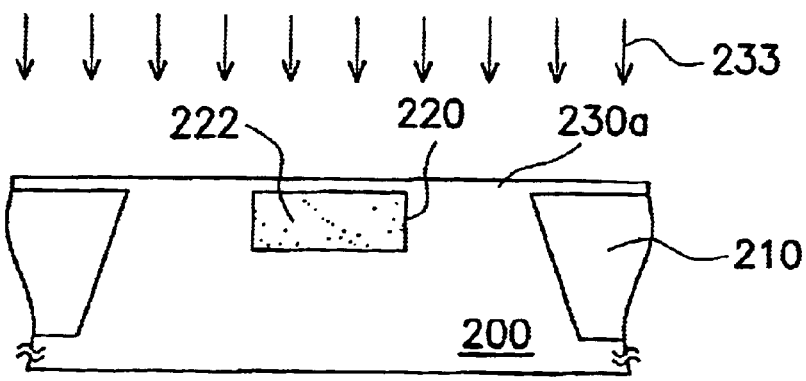

As shown in FIG. 4, a solid phase epitaxy (SPE) process is performed to convert the amorphous semiconductive layer 230 into a crystallized semiconductive layer 230a. When the amorphous semiconductive layer 230 is a single-layer amorphous silicon layer, the temperature of the SPE process is about 500–600° C. and the operation time is about 1–6 hr. A channel implantation process is performed to implant ions 233 into crystallized semiconductor layer 230a. A portion of the crystallized semiconductive layer 230a over the trench 220 is channel region. The dosage of the ions 233 is about $10^{12}$–$6 \times 10^{13}$/cm$^3$. Taking the formation of an NMOS as an example, the ions 233 are P-type ions such as boron ions. On the contrary, the ions 233 are N-type ions such as arsenic ions or phosphorus ions when a PMOS is formed.

Besides, the doped crystallized semiconductive layer 230a mentioned above can be also formed by in-situ doping process. The in-situ doping process comprises the steps of introducing ions during the deposition of the amorphous semiconductive layer 230 and performing the SPE process to convert the doped amorphous semiconductive layer 230 into the doped crystallized semiconductive layer 230a.

Figure 5A:
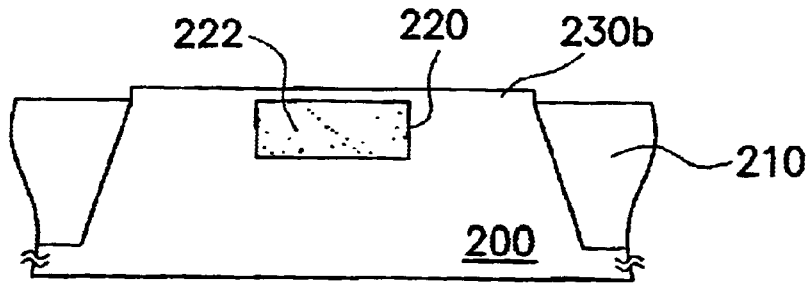
Figure 5B:
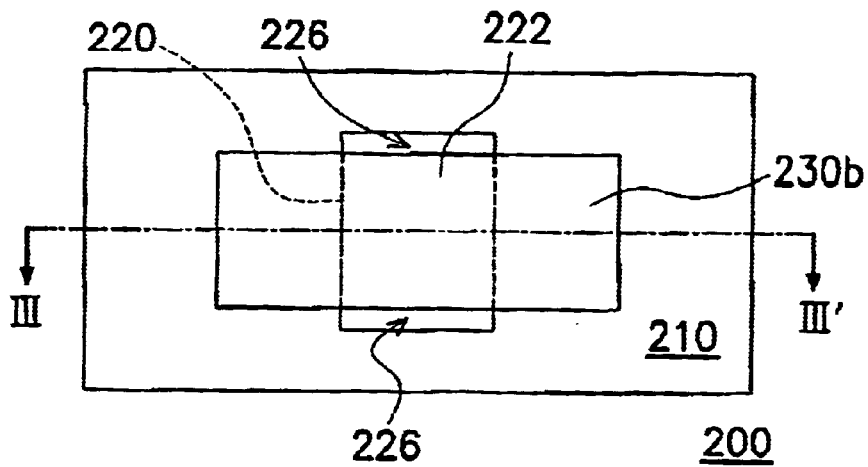

As shown in FIGS. 5B and 5A, the crystallized semiconductive layer 230a is patterned to form a device region 230b covering the central portion of the sacrificial layer 220. The device region 230b, the substrate 200 and the STI 210 together constitute narrow spaces 226 to expose the surface area of the sacrificial layer 222 between the device region 230b and the STI 210.

Figure 6A:
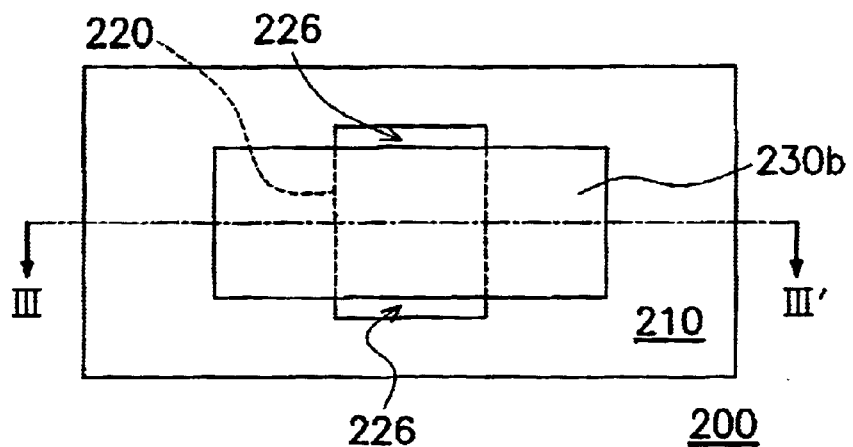
Figure 6B:
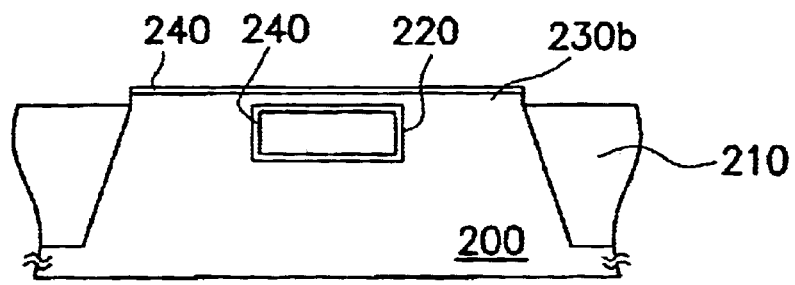

As shown in FIGS. 6B and 6A, the sacrificial layer 222 is removed by isotropic etching process so that the device region 230b spans the trench 220. The isotropic etching process can be a wet etching and the etchant stripes the sacrificial layer 222 from the trench 220 by passing through the narrow spaces 226. When the sacrificial layer 222 is silicon nitride layer, the etchant can be phosphoric acid. A gate dielectric layer 240 is formed on both inner surface of the trench 220 and the surface of the device region 230b. The gate dielectric layer 240 can be a silicon oxide layer or a nitrided gate oxide layer formed by thermal oxidation process, for example. It should be noticed that the step for forming the nitrided gate oxide layer comprises forming the gate oxide layer and then performing a nitridation process on the gate oxide layer.

Figure 7:
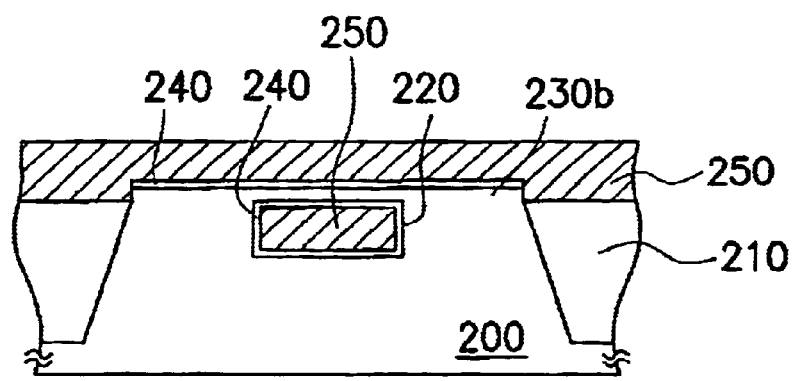

As shown in FIG. 7, a conductive layer 250 is formed over the substrate 200 and to fills the trench 220. The conductive layer 250 can be a polysilicon layer or a poly Si—Ge layer formed by LPCVD, for example. Alternatively, the conductive layer 250 can be polycide or metal, for example.

Figure 8A:
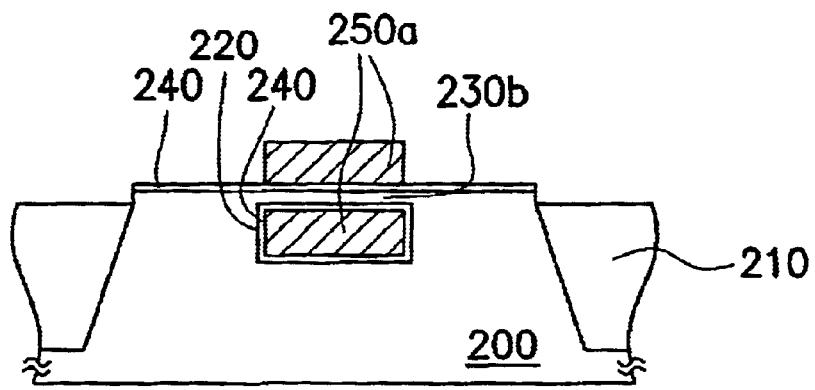
Figure 8B:
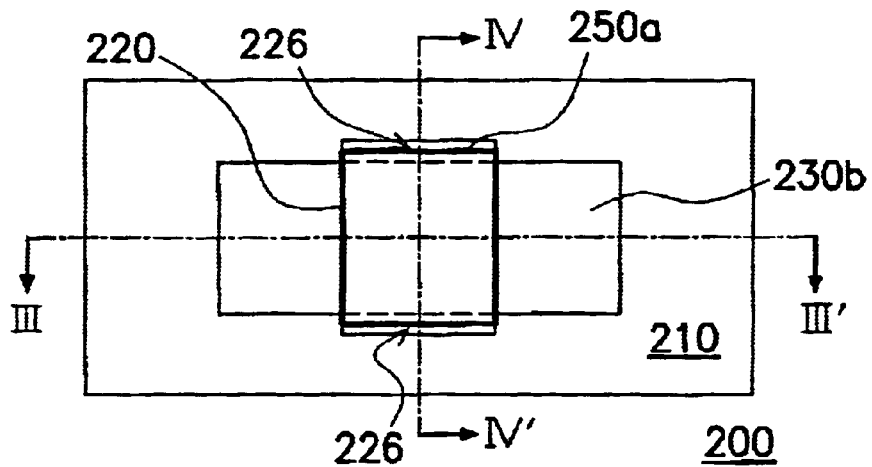
Figure 8C:
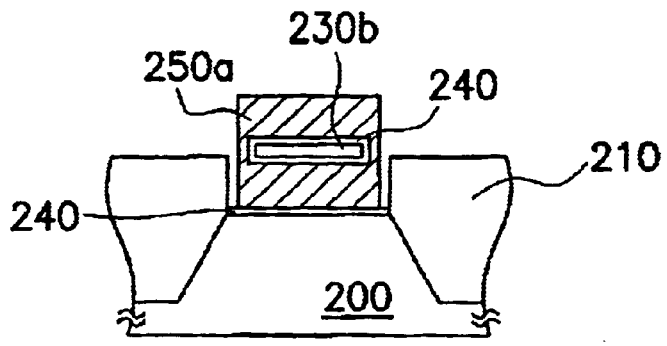
FIG. 8C is a cross-sectional view of FIG. 8B along line IV–IV'.

As shown in FIGS. 8C, 8A and 8B, the conductive layer 250 is patterned to form a horizontal surround gate 250a surrounding a portion of the device region 230b over the trench 220. The portion of the device region 230b surrounded by the horizontal surround gate 250a is a channel region.

Figure 9:
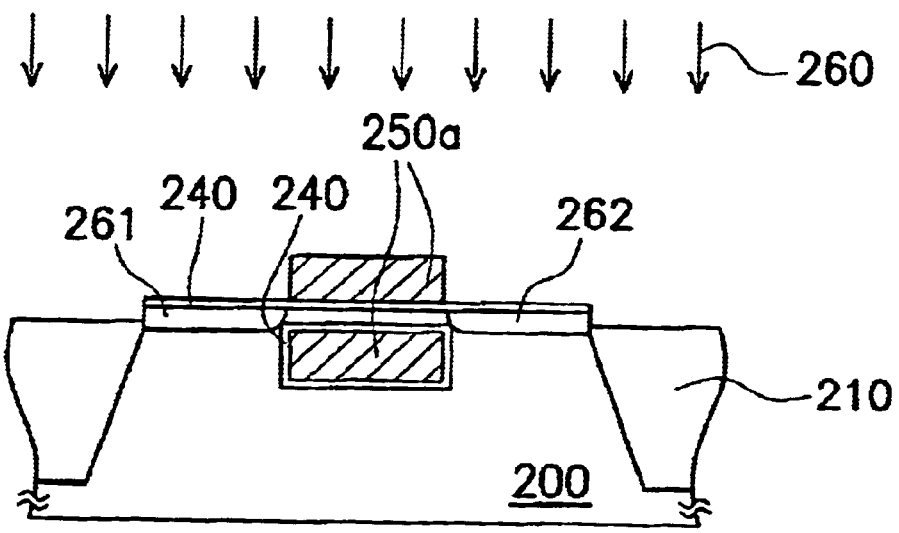

As shown in FIG. 9, a source region 261 and a drain region 262 are formed in the substrate 200 adjacent to the channel region. The method for forming the source region 261 and the drain region 262 comprises an ion implantation process or and diffusion doping process by using the horizontal surround gate 250a as a mask, for example.

Figure 10:
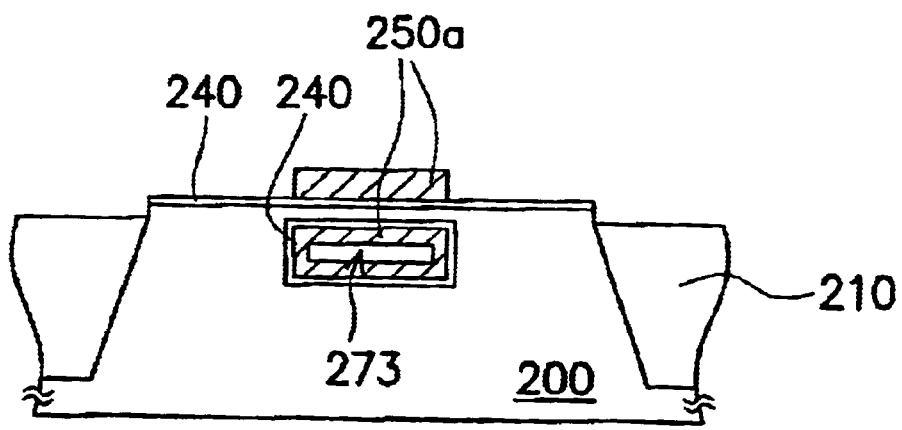
FIG. 10 is a schematic, cross-sectional view of a horizontal surround gate with a hollow gate structure.

As shown in FIG. 10 together with FIGS. 7 and 8, as long as gate dielectric layer 240 on the bottom surface of the device region 230b is covered by the gate 250a, the electric inversion phenomenon will occurs below the device region 230b. Therefore, the horizontal surround gate 250a under the device region 230b also can be a hollow gate structure with a free space 273 as shown in FIG. 10.

Alternatively, the source/drain region can also be formed by an ion implantation process right before the amorphous semiconductive layer 230 is formed. The advantage gained from this scheme is that the contamination of amorphous conductive layer 230 during the ion implantation step can be effectively avoided. Thus the reliability of the device can be improved.

In the present invention, because the extra-thin doped semiconductive layer is used as a channel region, there is no channel portion far from the gate. Therefore, the leakage can be dramatically decreased and the on-current can be greatly increased.

Moreover, since the horizontal surround gate 250a surrounds the channel region, therefore the channel region is well controlled by the gate electric field. Hence, the leakage can be dramatically decreased and the on-current can be greatly increased.

Besides, the extra-thin doped crystallized semiconductive layer, such as a epitaxy silicon layer, replaces the conventional SOI film to be a channel region, so that the substrate cost can be decreased.

Furthermore, by comparing with the fin-type FET, since the surface of the doped crystallized semiconductive layer in the present invention is not formed by dry etching, the performance of the device won't be affected.

Also, the source/drain region is formed by the conventional doping process in the invention. It is not necessary to form the risen source/drain. Therefore, the manufacturing process can be well controlled.

Further, the thickness of the channel region depends on the thickness of the doped crystallized semiconductive layer. Therefore, the issues caused by the electron beam and the anisotropic etching process can be totally solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A MOSFET, comprising:
   a substrate having a trench and a shallow trench isolation region enclosing the trench;
   a doped semiconductive layer disposed over the trench and on the substrate, wherein the doped semiconductive layer partially covers the trench, and the shallow trench isolation region encloses the trench and the doped semiconductive layer;
   a gate dielectric layer comprising a first portion and a second portion, wherein the first portion is disposed on a top surface of the doped semiconductive layer so as to fully cover the top surface of the doped semiconductive layer, and the second portion is disposed on all surfaces of the trench and covers a bottom surface of the doped semiconductive layer that is above the trench and exposed by the trench;
   a conductive layer comprising a first portion and a second portion, wherein the first portion is disposed on the first portion of the gate dielectric layer and covers the top surface of the doped semiconductive layer, and the second portion is disposed on the second portion of the gate dielectric layer and covers the bottom surface of the doped semiconductive layer that is above the trench and exposed by the trench, so that the second portion of the conductive layer is disposed in the trench and a the first portion of the conductive layer is disposed above the gate dielectric layer, wherein the first portion of the conductive layer is patterned to form a gate on the gate dielectric layer, so that the gate overlies a portion of the doped semiconductive layer that is over the trench, and wherein the doped semiconductive layer below the gate forms a channel region; and
   a source/drain region disposed partially within the substrate on either side of the gate and to the channel region, wherein the shallow trench isolation region abuts the source/drain region.

2. The MOSFET of claim 1, wherein the doped semiconductive layer includes a doped crystallized semiconductive layer.

3. The MOSFET of claim 2, wherein the doped crystallized semiconductive layer includes a doped epitaxy silicon layer.

4. The MOSFET of claim 3, wherein the thickness of the doped epitaxy silicon layer is about 1–50 nm.

5. The MOSFET of claim 1, wherein the gate further comprises a portion located in the trench and the portion of the gate in the trench is a solid structure.

6. The MOSFET of claim 1, wherein the gate further comprises a portion located in the trench and the portion of the gate in the trench is a hollow structure.

7. The MOSFET of claim 1, wherein the doped semiconductive layer covers a central portion of the trench.

8. The MOSFET of claim 1, wherein the gate dielectric layer includes a gate oxide layer.

9. The MOSFET of claim 1, wherein the gate dielectric layer includes a nitrided gate oxide layer.

10. The MOSFET of claim 1, wherein the gate is formed from polysilicon.

11. The MOSFET of claim 1, wherein the gate is formed from poly Si—Ge.

12. The MOSFET of claim 1, wherein the gate is formed from polycide.

13. The MOSFET of claim 1, wherein the gate is formed from metal.

14. The MOSFET of claim 1, wherein the depth of the trench is about 0.05—0.3 micron.

* * * * *